United States Patent
Sheperek et al.

(10) Patent No.: US 11,263,134 B1
(45) Date of Patent: Mar. 1, 2022

(54) BLOCK FAMILY COMBINATION AND VOLTAGE BIN SELECTION

(71) Applicant: MICRON TECHNOLOGY, INC., Boise, ID (US)

(72) Inventors: Michael Sheperek, Longmont, CO (US); Larry J. Koudele, Erie, CO (US); Mustafa N. Kaynak, San Diego, CA (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/008,024

(22) Filed: Aug. 31, 2020

(51) Int. Cl.
*G06F 12/0802* (2016.01)
*G06F 12/06* (2006.01)
*G11C 16/10* (2006.01)

(52) U.S. Cl.
CPC .......... *G06F 12/0802* (2013.01); *G06F 12/06* (2013.01); *G11C 16/107* (2013.01)

(58) Field of Classification Search
CPC .... G06F 12/0802; G06F 12/06; G11C 16/107
USPC .................................................... 365/185.11
See application file for complete search history.

(56) References Cited

U.S. PATENT DOCUMENTS

| 10,153,046 | B1 * | 12/2018 | Agarwal | G11C 16/107 |
| 2004/0210799 | A1 * | 10/2004 | Cargnoni | G06F 11/1064 714/42 |
| 2017/0271031 | A1 * | 9/2017 | Sharon | G06F 11/3058 |
| 2018/0196749 | A1 * | 7/2018 | Koo | G06F 12/0246 |

* cited by examiner

*Primary Examiner* — Anthan Tran
(74) *Attorney, Agent, or Firm* — Lowenstein Sandler LLP

(57) ABSTRACT

A set of two or more block families associated with a first voltage bin are selected. Each block family includes two or more pages of a memory device that have been programmed within a corresponding time window. The set of two or more block families includes a first block family and a second block family. Values of a data state metric for each of the set of block families is determined. A first voltage for the first block family and a second voltage for the second block family is determined based on the values of the data state metric. In response to a determination that a difference between the first voltage and the second voltage satisfies a block family combination criterion, the second block family is merged with the first block family.

20 Claims, 15 Drawing Sheets

BLOCK METADATA TABLE 710

| Family | Blocks | Time | Temp |
|---|---|---|---|
| 0 | 0-9 | 1 | 31 |
| 1 | 10-19 | 1 | 42 |
| 2 | 20-29 | - | ... |
| 3 | 30-39 | - | ... |
| 4 | 40-49 | - | ... |
| 5 | 50-59 | - | ... |
| ... | ... | ... | ... |
| 59 | 400-499 | - | ... |
| 60 | 500-599 | - | ... |
| 61 | 600-699 | - | ... |
| 62 | 700-799 | - | ... |
| 63 | 800-899 | - | ... |
| 64 | 900-999 | - | ... |

BLOCK FAMILY METADATA TABLE 720

| Family | Die 0 | Die 1 | ... | Die N-1 | Die N |
|---|---|---|---|---|---|
| 0 | 7 | 7 | 7 | 7 | 7 |
| 1 | 7 | 7 | 7 | 7 | 7 |
| 2 | 7 | 7 | 7 | 7 | 7 |
| 3 | 7 | 7 | 7 | 7 | 7 |
| 4 | 7 | 7 | 7 | 7 | 7 |
| 5 | 7 | 6 | 7 | 7 | 6 | ← 724
| ... | ... | ... | ... | ... | ... |
| 59 | 1 | 1 | 1 | 1 | 1 |
| 60 | 1 | 0 | 1 | 0 | 1 | ← 722
| 61 | 1 | 0 | 1 | 0 | 1 |
| 62 | 1 | 0 | 0 | 0 | 0 |
| 63 | 0 | 0 | 0 | 0 | 0 |
| 64 | 0 | 0 | 0 | 0 | 0 |

FIG. 7

| BLOCK METADATA TABLE 710 | | | |
|---|---|---|---|
| Family | Blocks | Time | Temp |
| 0 | 0-9 | 1 | 31 |
| 1 | 10-19 | 1 | 42 |
| 2 | 20-29 | - | ... |
| 3 | 30-39 | - | ... |
| 4 | 40-49 | - | ... |
| 5 | 50-59 | - | ... |
| ... | ... | - | ... |
| 59 | 400-499 | - | ... |
| 60 | 500-599 | - | ... |
| 61 | 600-699 | - | ... |
| 62 | 700-799 | - | ... |
| 63 | 800-899 | - | ... |
| 64 | 900-999 | - | ... |

1110 →
1112 →

| BLOCK FAMILY METADATA TABLE 720 | | | | | |
|---|---|---|---|---|---|
| Family | Die 0 | Die 1 | ... | Die N-1 | Die N |
| 0 | 7 | 7 | 7 | 7 | 7 |
| 1 | 7 | 7 | 7 | 7 | 7 |
| 2 | 7 | 7 | 7 | 7 | 7 |
| 3 | 7 | 7 | 7 | 7 | 7 |
| 4 | 7 | 7 | 7 | 7 | 7 |
| 5 | 7 | 6 | 7 | 7 | 6 |
| ... | ... | ... | ... | ... | ... |
| 59 | 1 | 1 | 1 | 1 | 1 |
| 60 | 1 | 0 | 1 | 0 | 1 |
| 61 | 1 | 0 | 1 | 0 | 1 |
| 62 | 0 | 0 | 0 | 0 | 0 |
| 63 | 0 | 0 | 0 | 0 | 0 |
| 64 | 0 | 0 | 0 | 0 | 0 |

BLOCK METADATA TABLE 710

| Family | Blocks | Time | Temp |
|---|---|---|---|
| 0 | 0-9 | 1 | 31 |
| 1 | 10-19 | 1 | 42 |
| 2 | 20-29 | - | ... |
| 3 | 30-39 | - | ... |
| 4 | 40-49 | - | ... |
| 5 | 50-59 | - | ... |
| ... | ... | - | ... |
| 59 | 400-499 | - | ... |
| 60 | 500-699 | - | ... |
| 61 | 600-699 | - | ... |
| 62 | 700-799 | - | ... |
| 63 | 800-899 | - | ... |
| 64 | 900-999 | - | ... |

1110 → (points to family 60)
1112 → (points to family 61)

BLOCK FAMILY METADATA TABLE 720

| Family | Die 0 | Die 1 | ... | Die N-1 | Die N |
|---|---|---|---|---|---|
| 0 | 7 | 7 | 7 | 7 | 7 |
| 1 | 7 | 7 | 7 | 7 | 7 |
| 2 | 7 | 7 | 7 | 7 | 7 |
| 3 | 7 | 7 | 7 | 7 | 7 |
| 4 | 7 | 7 | 7 | 7 | 7 |
| 5 | 7 | 6 | 7 | 7 | 6 |
| ... | ... | ... | ... | ... | ... |
| 59 | 1 | 1 | 1 | 1 | 1 |
| 60 | 1 | 0 | 1 | 0 | 1 |
| 61 | 1 | 0 | 1 | 0 | 1 |
| 62 | 0 | 0 | 0 | 0 | 0 |
| 63 | 0 | 0 | 0 | 0 | 0 |
| 64 | 0 | 0 | 0 | 0 | 0 |

722 → (points to family 60 row)

FIG. 11B

| BLOCK FAMILY METADATA TABLE 720 | | | | | | |
|---|---|---|---|---|---|---|
| Family | Die 0 | Die 1 | ... | Die N-1 | Die N | |
| 0 | 7 | 7 | 7 | 7 | 7 | |
| 1 | 7 | 7 | 7 | 7 | 7 | |
| 2 | 7 | 7 | 7 | 7 | 7 | |
| 3 | 7 | 7 | 7 | 7 | 7 | |
| 4 | 7 | 7 | 7 | 7 | 7 | |
| 5 | 7 | 6 | 7 | 7 | 6 | |
| ... | ... | ... | ... | ... | ... | |
| 59 | 1 | 1 | 1 | 1 | 1 | |
| 60 | 1 | 1 | 1 | 1 | 1 | |
| 62 | 1 | 0 | 0 | 0 | 0 | ← 722 |
| 63 | 0 | 0 | 0 | 0 | 0 | |
| 64 | 0 | 0 | 0 | 0 | 0 | |

| BLOCK METADATA TABLE 710 | | | |
|---|---|---|---|
| Family | Blocks | Time | Temp |
| 0 | 0-9 | 1 | 31 |
| 1 | 10-19 | 1 | 42 |
| 2 | 20-29 | - | ... |
| 3 | 30-39 | - | ... |
| 4 | 40-49 | - | ... |
| 5 | 50-59 | - | ... |
| ... | ... | ... | ... |
| 59 | 400-499 | - | ... |
| 60 | 500-699 | - | ... |
| 62 | 700-799 | - | ... |
| 63 | 800-899 | - | ... |
| 64 | 900-999 | - | ... |

| | Die 0 | | Die 1 | | Die 2 | | Die 3 | |
|---|---|---|---|---|---|---|---|---|
| BF 60 | 26 | | 25 | | 24 | | 24 | |
| BF 61 | 25 | | 27 | | 25 | | 28 | |

BLOCK FAMILY COMBINATION AND VOLTAGE BIN SELECTION

TECHNICAL FIELD

Embodiments of the disclosure relate generally to memory sub-systems, and more specifically, relate to block family bin combination and voltage bin selection.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 7 schematically illustrates example metadata maintained by the memory sub-system controller, in accordance with aspects of the present disclosure.

FIGS. 11A-C illustrate combining block families and selecting a voltage bin for a combined block family, in accordance with embodiments of the present disclosure.

FIG. 12 schematically illustrates an example of combining block families based on a voltage metric of each die in the block families, in accordance with embodiments of the present disclosure.

DETAILED DESCRIPTION

Figure 1:
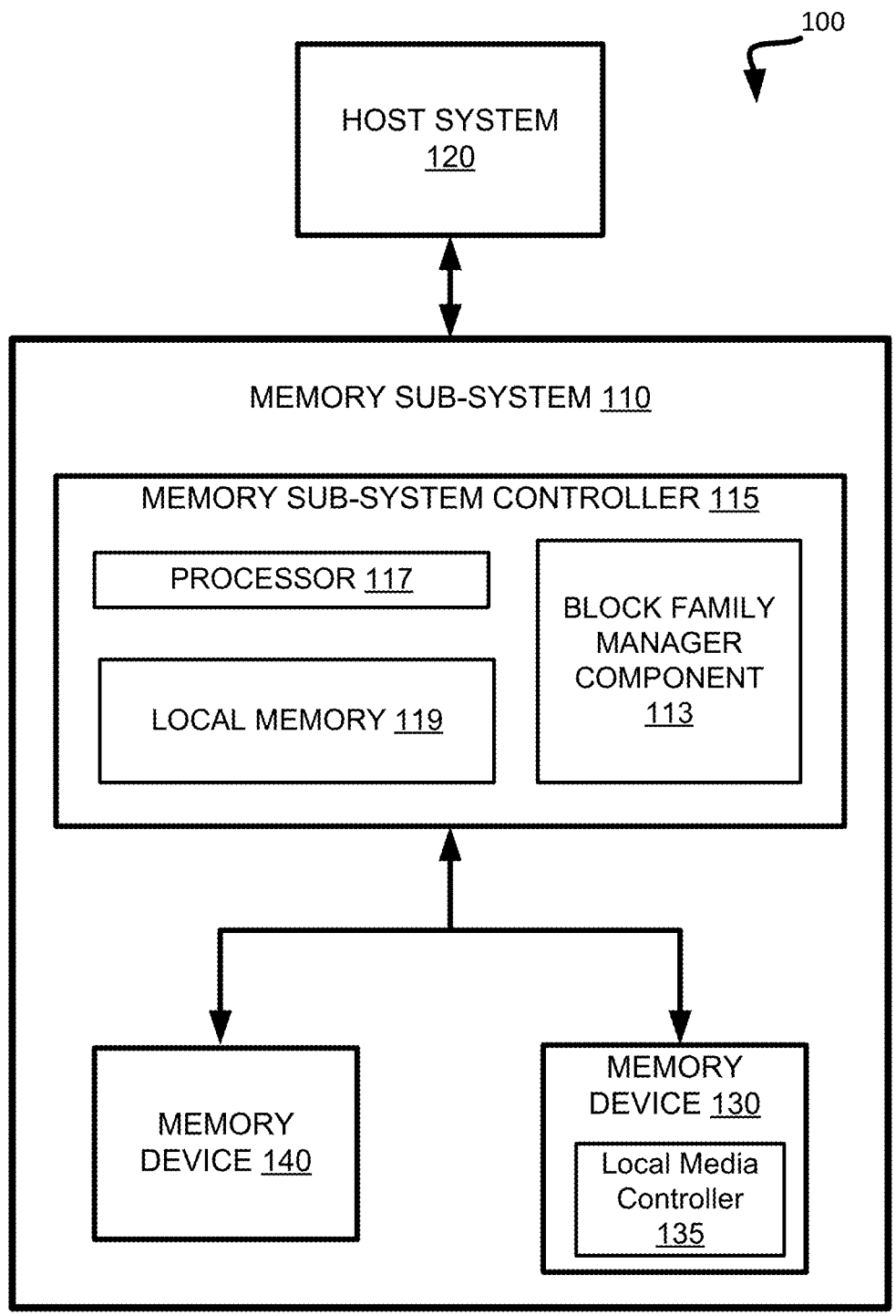
FIG. 1 illustrates an example computing environment that includes a memory sub-system, in accordance with some embodiments of the present disclosure.

Aspects of the present disclosure are directed to block family combination and voltage bin selection. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative- and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, a block family experiences a specified temperature range using an aggregate temperature, which can change or be defined according to a temperature metric in different embodiments. For example, in response to a timer reaching a soft closure value, a controller of the memory sub-system can perform a soft closure of the block family. Or, alternatively, in response to an aggregate temperature (based on temperature values received from temperature sensor(s) of the memory device) being greater than or equal to a specified threshold temperature, the controller can likewise perform a soft closure of the block family.

After performing the soft closure, the memory sub-system can continue to program to a partially written block until the timer reaches hard closure value or the block family satisfies a hard closure criteria. In this way, the memory sub-system has an extension time before the hard closure during which to complete writing to the partially written block, decide whether to partition the block, or to write dummy data to the unwritten portion of the block after hard closure. After hard closure of one block family, further programming to dice of the memory device is to a newly opened block family. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (also referred to as a calibration scan) in order to evaluate a data state metric (e.g., a bit error rate or voltage) and associate each die of every block family with one of the predefined threshold voltage offset bins (referred to as voltage bins), which is in turn associated with the voltage offset to be applied for read operations. The associations of pages or blocks with block families and block families and dies with voltage bins can be stored in respective metadata tables maintained by the memory sub-system controller.

Generally, the temporal voltage shift for younger block families (i.e., block families that are more recently created) is more significant than the temporal voltage shift for older block families (i.e., block families that are less recently created). The memory sub-system controller can periodically perform the calibration scan for a block family based on the age of the block family, which corresponds to the voltage bin associated with the block family. For example, in an 8 voltage bin architecture, newly created block families can be associated with voltage bin 0, while the oldest (i.e., least recently created) block families are associated with voltage bin 7. The memory sub-system controller performs the calibration scan for the block families in voltage bin 0 more frequently than for the block families in voltage bin 7, based on the age of the block families associated with voltage bin 0 (i.e., based on the logarithmic linear nature of SCL).

As block families age, the temporal voltage shifts for temporally adjacent block families (i.e., block families that are adjacent in the block family creation order) can converge. Since metadata tables maintained by the memory sub-system controller can have a finite amount of space to store records associated with different block families, a memory sub-system controller can combine multiple active block families into a single block family. The memory sub-system controller can perform a calibration scan to identify active block families that are candidates for combination. For example, in response to determining the total number of block families created for a memory device reaches a threshold number, the memory sub-system controller performs a series of operations on one or more memory cells of each block family to obtain a set of data state metrics for the block family. In response to determining a combination criterion is satisfied based on the obtained sets of data state metrics for each block family, the memory sub-system controller updates records for the adjacent block families (i.e., in a metadata table) to indicate the adjacent block families are now associated with a single block family, thus combining the adjacent block families.

In some embodiments, the memory sub-system controller can perform the calibration scan and the combination scan as separate process for the memory device. Depending on the number of new block families created at the memory device, the memory sub-system controller can perform the calibration process at the frequency that would be sufficient to maintain the total number of block families below a threshold number. Also, depending on temporal voltage shifts for each block family, the memory sub-system controller can perform the calibration scan at another frequency to associate each block family with an appropriate voltage bin (i.e., a voltage bin associated with a threshold voltage offset that will reduce an error rate for a read operation performed to the block family). As each process involves obtaining measurements of a current state of data at the block family, performing calculations based on the measured state data, and storing data associated with the calculations to memory, each process can utilize a significant amount of memory sub-system resources. As a result, the performance of each separate process at the memory device can result in an increase in overall latency and a decrease in overall efficiency of the memory sub-system.

Aspects of the present disclosure address the above and other deficiencies by performing a block family management operation to calibrate a certain number of block families to be associated with an appropriate voltage bin, based on the current data state metric and/or temporal voltage shift values for the block families, and combine block families indicating the same or similar data state metric and/or temporal voltage shift values. The memory sub-system controller can periodically initiate a calibration scan for block families associated with a chosen voltage bin (e.g., based on a predefined calibration scan frequency for the voltage bin). The memory sub-system controller can select a predefined number of block families from the chosen bin and evaluate the data state metric for each selected block family. In response to determining a block family combination criterion is satisfied based on the evaluated state metric for each selected block family, the memory sub-system controller can combine the block families by updating a block metadata table to associate pages or blocks of the selected block families with a single block family.

Advantages of the present disclosure include, but are not limited to, decreasing a number of block family management operations performed for a memory device. During each periodic calibration scan of the memory device, the memory sub-system controller updates metadata for each block family to associate the block family with an appropriate voltage bin and identifies block families that are candidates for combination. By combining candidate block families identified during the calibration scan, the memory sub-system controller can maintain the number of block families at a memory device at a target number without performing additional block family combination scans. As such, the number of block family combination scans is reduced and a significant amount of memory sub-system resources are made available for other processes. This results in a decrease in overall memory sub-system latency and an increase in overall memory sub-system efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative- and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAIVI), negative- or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130, 140 (e.g., NAND type flash memory devices), such that the payload is distributed through a subset of dies, while the remaining one or more dies are used to store the error correction information (e.g., party bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager component 113 that can select threshold voltage offset bins (referred to as voltage bins) to be associated with block families at a memory device and identify block families that are candidates for combination. In some embodiments, the memory sub-system controller 115 includes at least a portion of the block family manager component 113. For example, the memory sub-system controller 115 can include a processor 117 (processing device) configured to execute instructions stored in local memory 119 for performing the operations described herein. In some embodiments, the block family manager component 113 is part of the host system 110, an application, or an operating system. Further details regarding block families and block family manager component 113 are described below.

Figure 2:
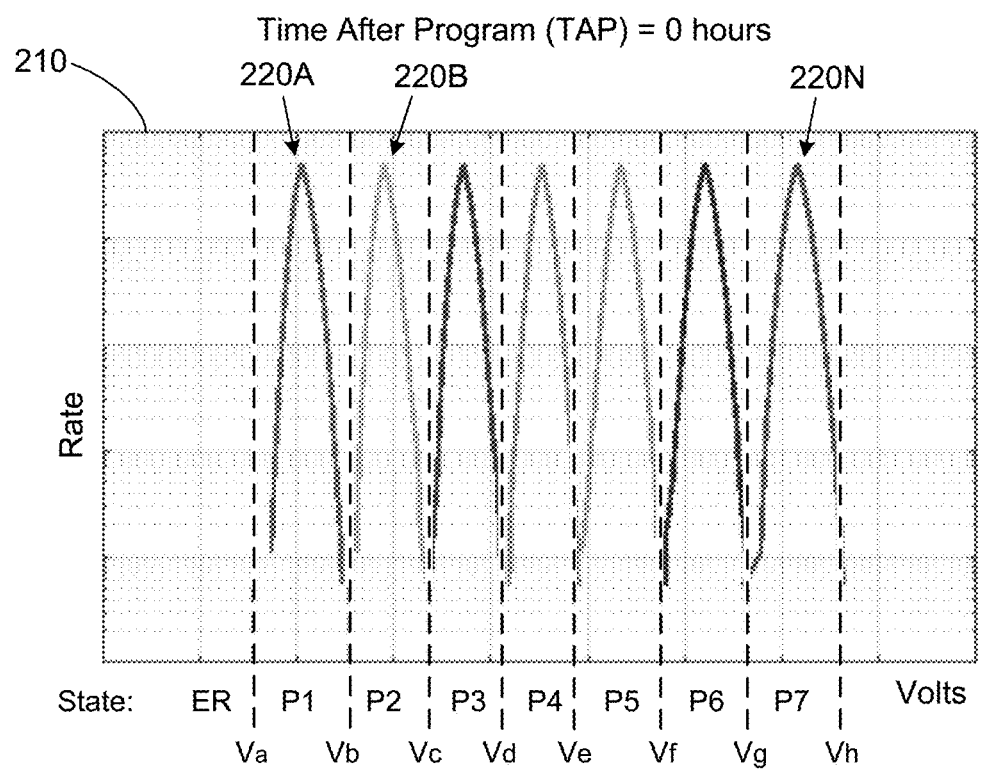
FIG. 2 schematically illustrates the temporal voltage shift caused by the slow charge loss exhibited by triple-level memory cells, in accordance with some embodiments of the present disclosure.
Figure 2:
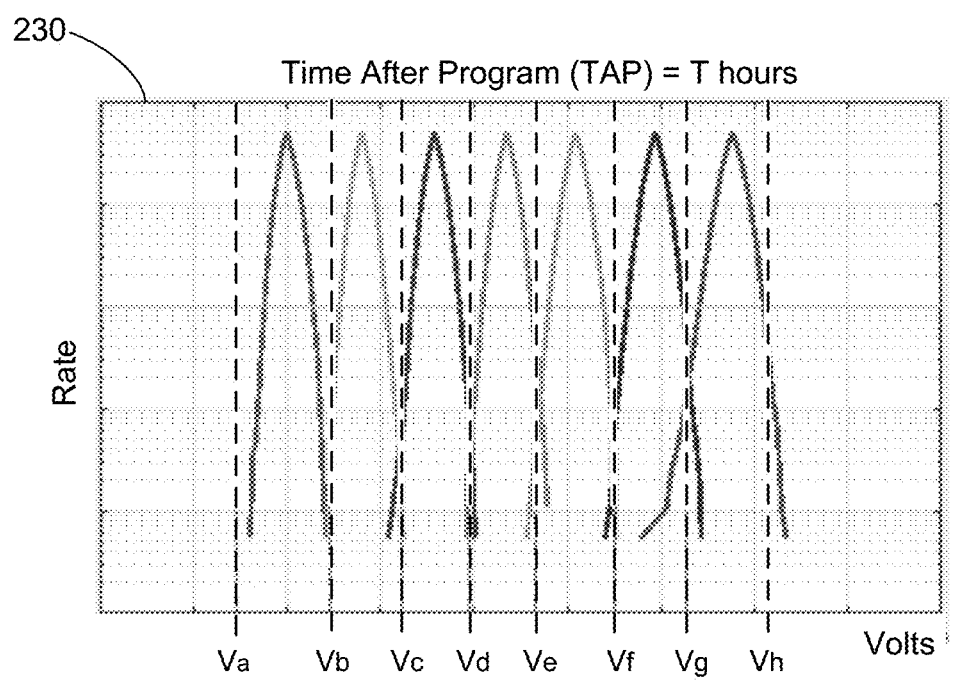

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

As noted above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the read threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

As seen from comparing example charts 210 and 230, which reflect the time periods immediately after programming and a respective number of hours after programming, respectively, the voltage distributions change in time due to the slow charge loss, which results in drifting values of the appropriate read threshold voltage levels, which are shown by dashed vertical lines. In various embodiments of the present disclosure, the temporal voltage shift is selectively tracked for programmed pages or blocks grouped by block families, and appropriate voltage offsets, which are based on page or block affiliation with a certain block family, are applied to the base read levels in order to perform read operations.

Figure 3:
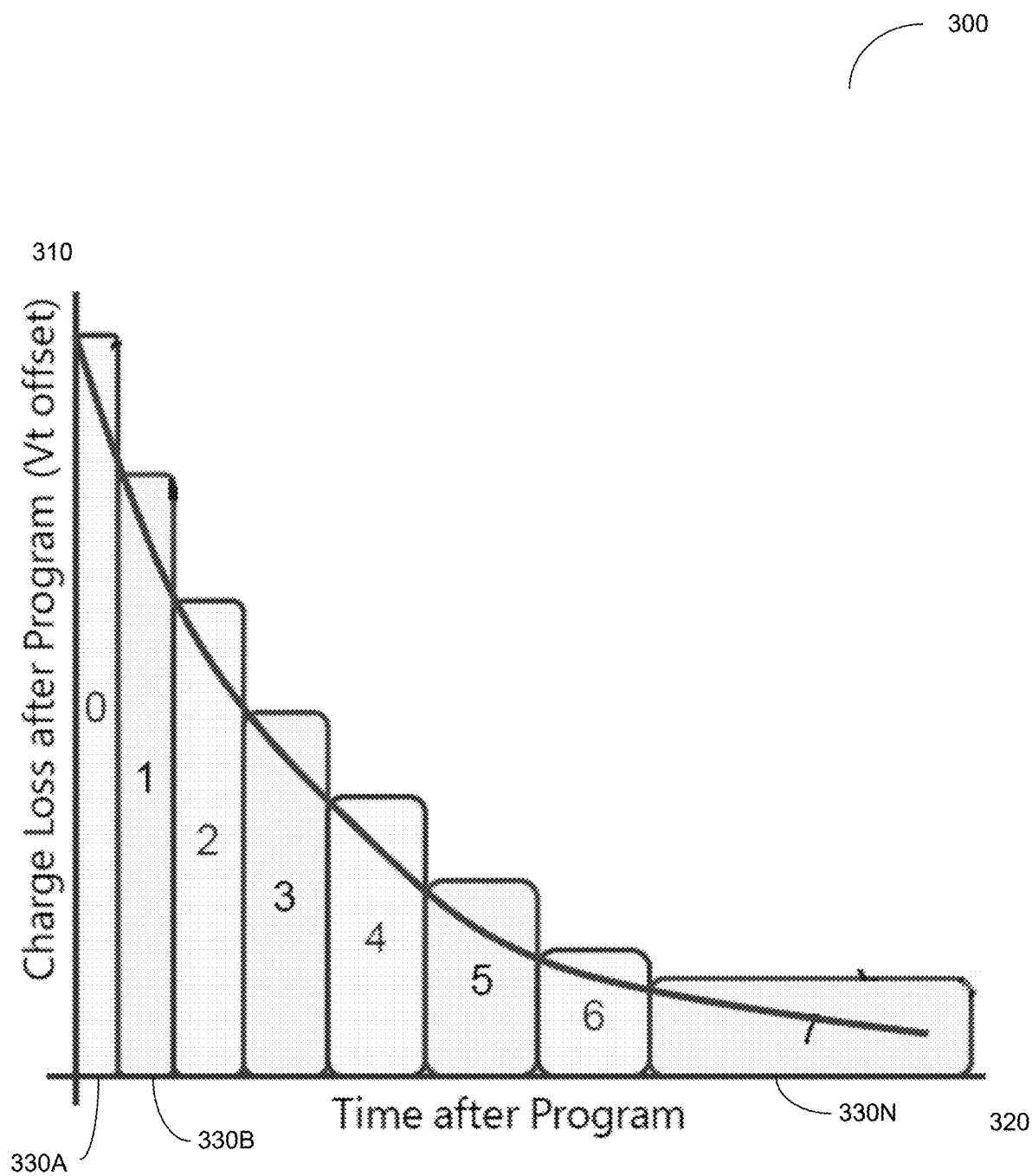
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph illustrating the dependency of the threshold voltage offset on the time after program (i.e., the period of time elapsed since the a page had been programmed, in accordance with some embodiments of the present disclosure. As schematically illustrated by FIG. 3, blocks families of the memory device are grouped into bins 330A-330N, such that each block family includes one or more pages or blocks that have been programmed within a specified time window and a specified temperature window. As noted herein above, since the time elapsed after programming and temperature are the main factors affecting the temporal voltage shift, all pages, blocks, and/or partitions within a single block family are presumed to exhibit similar distributions of threshold voltage changes in memory cells, and thus would require the same voltage offsets for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with a particular bin (e.g., bin 0, bin 1, bin 2). Then, the memory sub-system controller can periodically perform a calibration process in order to associate each die of every block family with one of the predefined voltage bins (bins 0-7 in the illustrative example of FIG. 3), which is in turn associated with the voltage offset to be applied for read operations. The associations of blocks with block families and block families and dies with voltage bins can be stored in respective metadata tables maintained by the memory sub-system controller, such as metadata table 900 described with respect to FIGS. 9A-F below.

Figure 4:
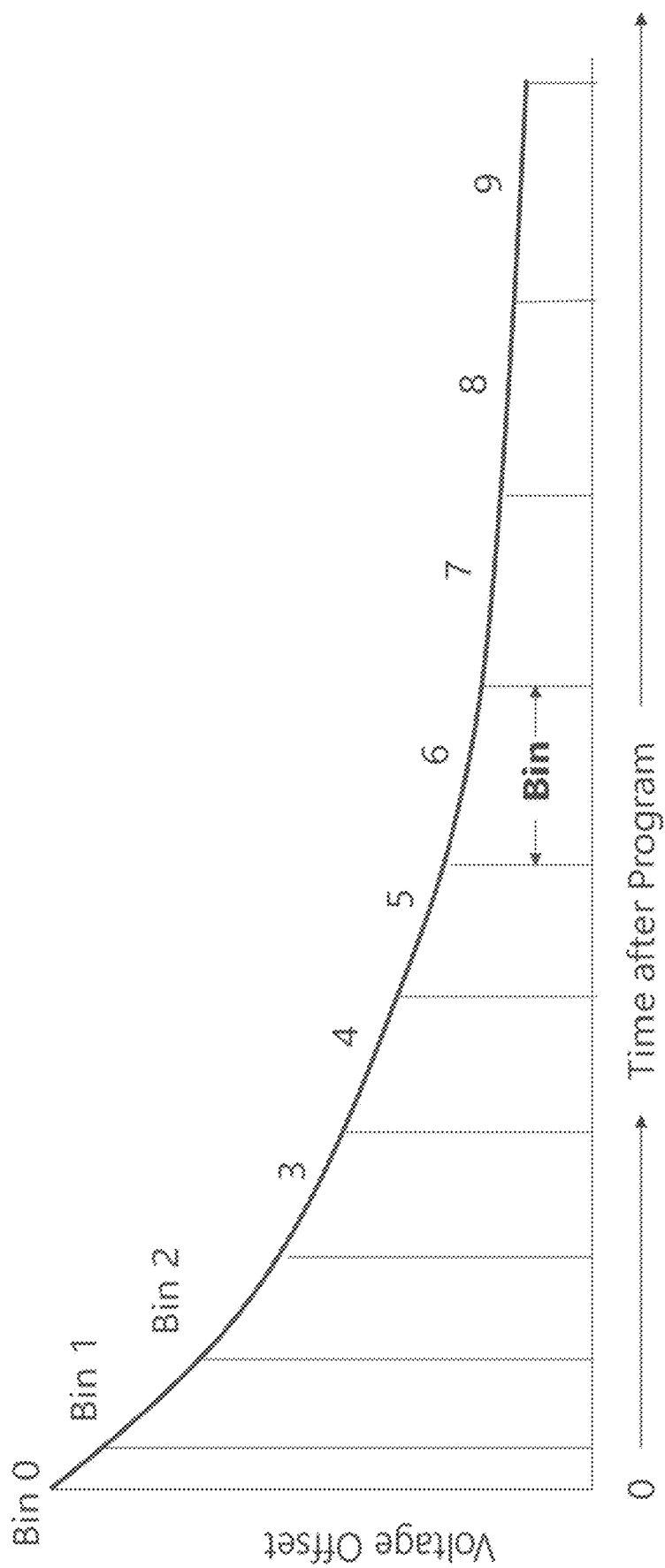
FIG. 4 schematically illustrates a set of predefined threshold voltage offset bins, in accordance with embodiments of the present disclosure.

FIG. 4 schematically illustrates a set of predefined threshold voltage offset bins (referred to as voltage bins herein), in accordance with embodiments of the present disclosure. As schematically illustrated by FIG. 4, the threshold voltage offset graph can be subdivided into multiple voltage bins, such that each voltage bin corresponds to a predetermined range of threshold voltage offsets. While the illustrative example of FIG. 4 defines ten voltage bins, in other implementations, various other numbers of voltage bins can be employed (e.g., 64 bins). The memory sub-system controller can associate each die of every block family of each die with a voltage bin, based on a periodically performed calibration process, described in further detail below. Or the memory sub-system controller can associate each block family with a single voltage bin across multiple die, or all die within the system.

Figure 5:
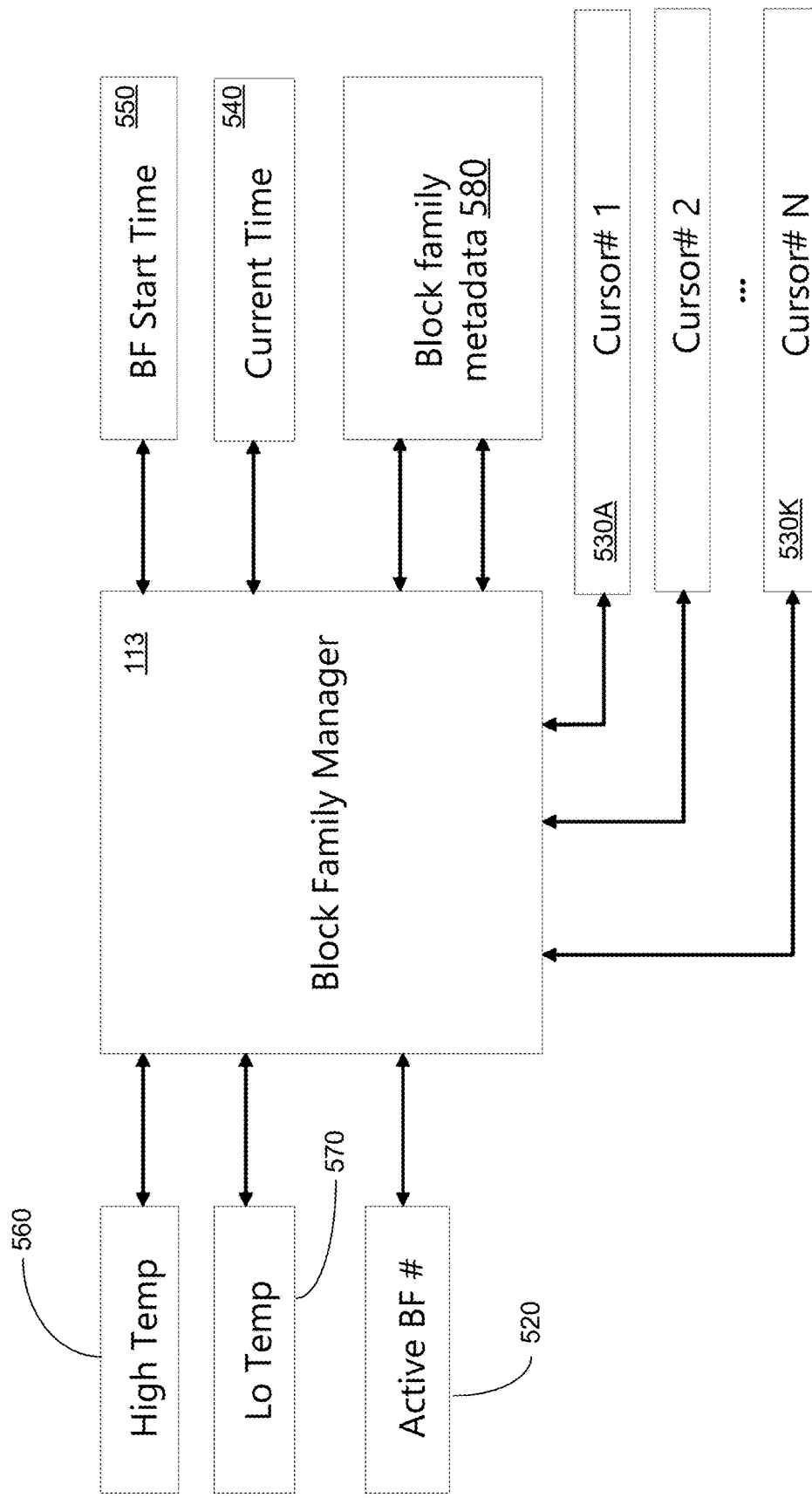
FIG. 5 schematically illustrates block family management operations implemented by a block family manager component, in accordance with embodiments of the present disclosure.

FIG. 5 schematically illustrates block family management operations implemented by the block family manager component 113 of the memory sub-system controller 115, in accordance with embodiments of the present disclosure. As schematically illustrated by FIG. 5, the block family manager component 113 can maintain, in a memory variable, an identifier 520 of the active block family, which is associated with one or more pages or blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, block family manager component 113 stores the current time 540 in a memory variable as the block family start time 550. As the pages or blocks are programmed, block family manager component 113 compares the current time 540 to the block family start time 550. Responsive to detecting that the difference of the current time 540 and the block family start time 550 is greater than or equal to the specified time period (e.g., a predetermined number of minutes), block family manager component 113 updates the memory variable storing the active block family identifier 520 to store the next block family number (e.g., the next sequential integer number), and the memory variable storing the block family start time 550 is updated to store the current time 540.

The block family manager 510 also maintains two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, block family manager component 113 associates the block with the currently active block family. The association of each block with a corresponding block family is reflected by the block family metadata 580, as described in more detail herein below with reference to FIG. 7.

As described previously, based on a periodically performed calibration process, the block family manager component 113 associates each die of every block family with a voltage bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation. Block family manager 113 determines the particular voltage bin corresponding to the chosen threshold voltage offset and updates metadata for the block family to correspond to the determined voltage bin.

In some embodiments, the frequency at which the memory sub-system controller performs the calibration process for each voltage bin can be based on an age of the block families associated with the voltage bin. As described previously with respect to FIG. 3, newly created block families can be associated with voltage bin 0 and older block families on the memory device can be associated with subsequently numbered voltage bins. The temporal voltage shift for block families in a younger voltage bin is faster than the temporal voltage shift for block families associated with an older voltage bin. This is illustrated in FIG. 4, as the voltage offset for bin 0 shifts at quicker rate than the voltage offset for older voltage bins (e.g., voltage bins 9, 8, 7, etc.). Therefore, the memory sub-system controller can perform the calibration process for block families associated with voltage bin 0 at a higher frequency than for block families associated with voltage bin 9 to associate each block family with an appropriate voltage bin.

Figure 6:
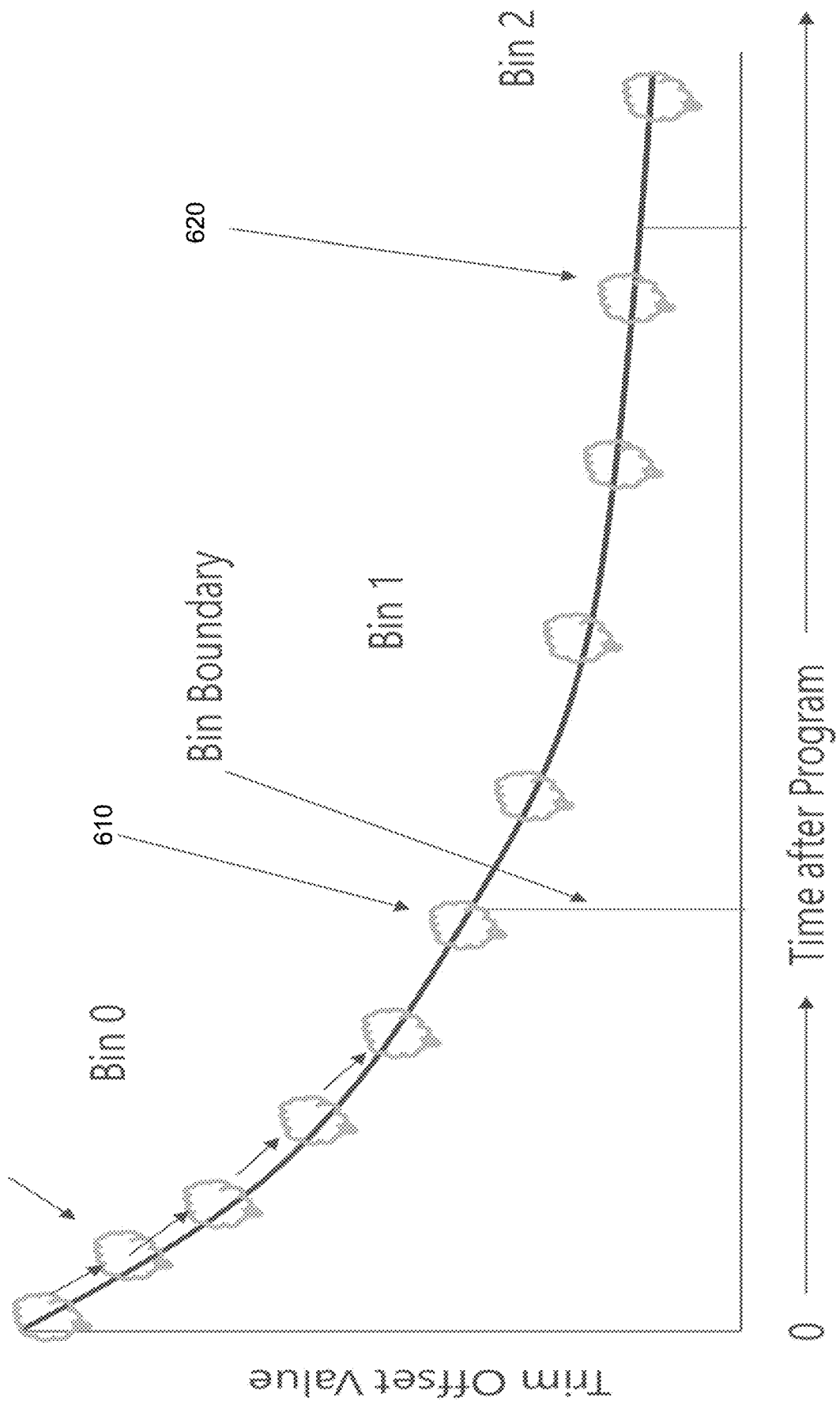
FIG. 6 schematically illustrates selecting block families for calibration, in accordance with embodiments of the present disclosure.

FIG. 6 schematically illustrates selecting block families for calibration, in accordance with embodiments of the present disclosure. Due to slow charge loss, the oldest block families in a voltage bin will migrate to the next voltage bin before any other block families of the current bin. As such, the memory sub-system controller can limit calibration operations to the oldest block families in a bin (e.g., block family 610 in bin 0 and block family 620 in bin 1). In some embodiments, the memory sub-system controller can identify the oldest block family in a voltage bin based on a bin boundary for the bin. A bin boundary can represent a boundary between two adjacent block families that are each associated with a different bin. The memory sub-system controller can identify the bin boundary for a particular voltage bin using a block family metadata table, described in further detail below.

FIG. 7 schematically illustrates example metadata maintained by the memory sub-system controller, in accordance with aspects of the present disclosure. In some embodiments, block family manager component 113 can maintain a block metadata table 710 and a block family metadata table 720. In some embodiments, block metadata table 710 and/or block family metadata table 720 can be stored in memory of the memory sub-system (e.g., at memory device 130, 140, local memory 119, etc.) and can be referenced by block family manager component 113 to determine a block family associated with a particular page or a particular block and/or a voltage bin associated with the block family. As illustrated in FIG. 7, block metadata table 710 and block family metadata table 720 can be separate metadata tables. In other or similar embodiments, block metadata table 710 and block family metadata table 720 can be included in a single metadata table. Additionally or alternatively, block metadata table 710 and block family metadata table 720 can be included in other metadata tables maintained by block family manager component 113, such as a superblock table, an offset table, etc.

In some embodiments, the block metadata table 710 can be indexed by block family and each entry of the block metadata table 710 can include an indication of one or more blocks, spanning one or more die, included in a block family. As illustrated in FIG. 7, block metadata table 710 is indexed by block family and includes an indication of a range of blocks included in each block family. In other or similar embodiments, the block metadata table 710 can be indexed by page or block and each entry can include an indication of the block family associated with the page or block. Each entry of block metadata table 710 can also include additional data corresponding to each block. For example, each entry of block metadata table 710 can include an indication of a time (e.g., in hours), when the page or block was written to the memory device. Additionally or alternatively, each entry can include an indication of a temperature (e.g., in Celsius) when the block was written to the memory device.

Block family table 720 is indexed by the block family number, such that each record of the block family table 720 specifies, for the block family referenced by the index of record, a set of voltage bins associated with respective dies of the block family. In other words, each record of the block family table 720 includes a vector, each element of which specifies the voltage bin associated with the die referenced by the index of the vector element (referred to as a bin pointer). The block family manager component 113 determines the voltage bin associated with a particular block family based on the bin pointer having the lowest value included in the vector for the block family. In an illustrative example, the lowest bin pointer value of the vector for block family 60 is associated with voltage bin 0 (i.e., for die 1). Therefore, block family manager component 113 associates block family 60 with voltage bin 0. In response to receiving a request to read data included in block family 60, block family manager component 113 uses the threshold voltage associated with voltage bin 0.

A bin boundary can represent a boundary between two adjacent block families that are each associated with a different voltage bin. Therefore, block family manager component 113 can identify a bin boundary for a voltage bin based on the bin pointers of the vector included in each record of the block family table 720. Block family manager component 113 can identify a voltage bin boundary for a particular voltage bin by identifying the oldest block family (i.e., the block family least recently created) associated with a vector including bin pointers for one or more die that correspond to the particular voltage bin. As illustrated in FIG. 7, the vectors for block families 60-64 include a bin pointer associated with voltage bin 0. Block family manager component 113 can associate block family 60 with a bin pointer vector 722 for voltage bin 0, as block family 60 is the oldest block family of block family table 720 where the bin pointer for die 1 corresponds to voltage bin 0. Block family manager component 113 can associate block family 5 with bin boundary 724 for voltage bin 6, in accordance with previously described embodiments.

Block family manager component 113 can perform a calibration scan for a particular voltage bin by identifying, using block family table 720, an oldest block family associated with the voltage bin (i.e., the block family associated with the bin boundary). In some embodiments, block family manager component 113 can perform the calibration scan for a predefined number of block families associated with the voltage bin (e.g., 2 block families for each calibration scan).

In such embodiments, block family manager component 113 can select, using block family table 720, the two oldest block families (e.g., block family 60 and block family 61) associated with the voltage bin. In response to selecting the predefined number of block families, block family manager component 113 can perform the calibration scan, in accordance with embodiments described herein.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the block table 710 is used to identify the block family identifier corresponding to the physical block number; then, the block family identifier is used as the index to the family table 720 in order to determine the voltage bin associated with the block family and the die; finally, the identified voltage bin is used as the index to an offset table (not illustrated) in order to determine the threshold voltage offset corresponding to the bin. The memory sub-system controller can then additively apply the identified threshold voltage offset to the base voltage read level in order to perform the requested read operation.

Figure 8:
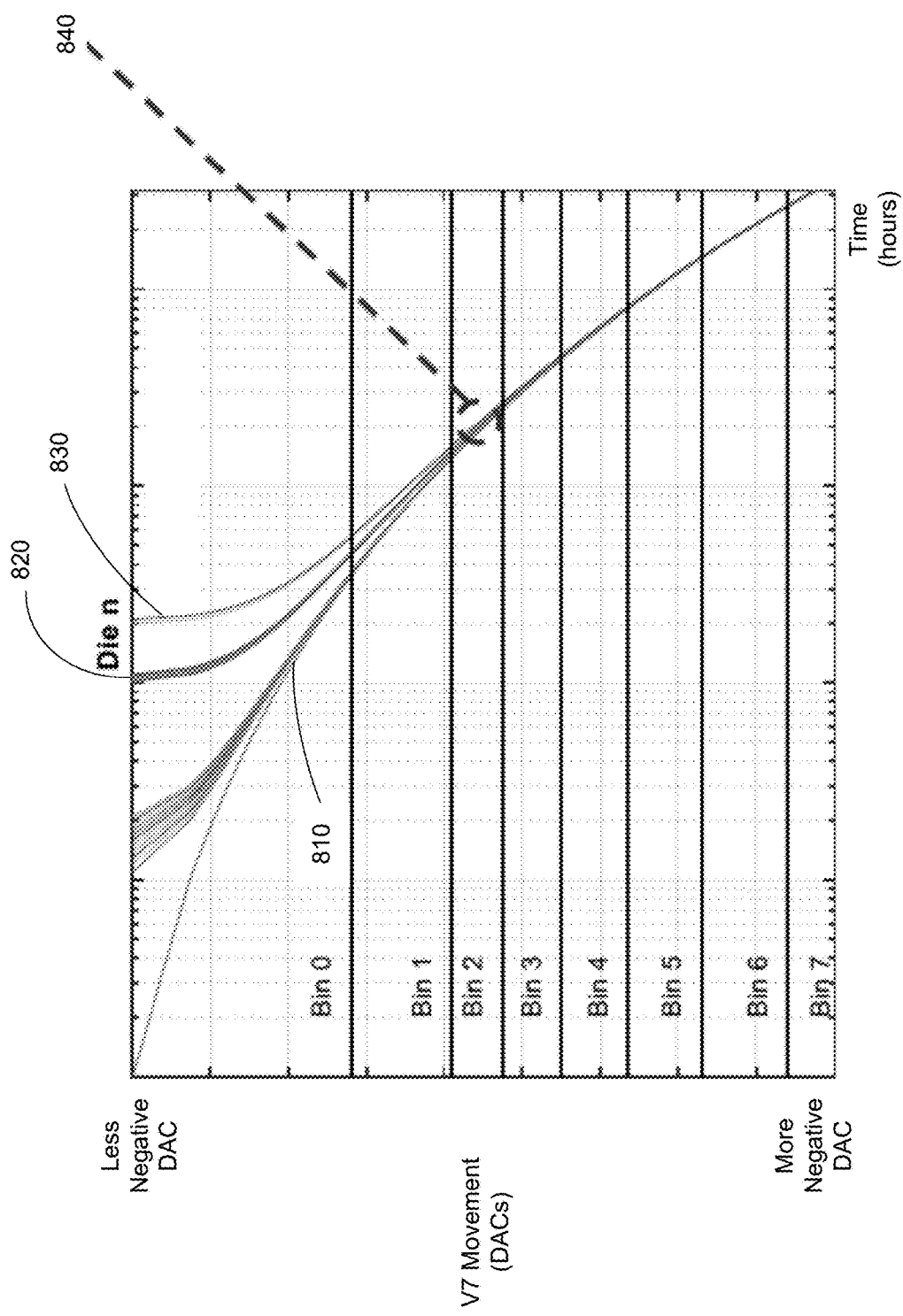
FIG. 8 is a graph illustrating temporal voltage shift of dies of multiple block families converging to a similar value, in accordance with embodiments of the present disclosure.

FIG. 8 is a graph 800 illustrating temporal voltage shift of dies of multiple block families converging to a similar value, in accordance with embodiments of the present disclosure. As described previously, block family manager component 113 creates multiple block families (block family 810, block family 820, and block family 830) over time (represented logarithmically by the bottom x-axis). Each die (represented by a sloping line originating from the top x-axis) of each block family 810, 820, 830 is associated with voltage bin 0 upon the creation of a block family. The y-axis represents the voltage offset for each bin. The voltage offset is represented in DAC (digital-to-analog converter) units (e.g., a DAC value), where one DAC value is equivalent to 10 millivolts.

As the data in each block family 810, 820, 830 ages, the voltage offset for each die of each block family 810, 820, 830 increases in magnitude. As described previously, a periodical calibration process performed by the block family manager component 113 determines whether to associate each die of the block families 810, 820, 830 with a new voltage bin. As seen in FIG. 8, as time progresses, the voltage offset of the dies of the block families 810, 820, 830 can converge (as shown at 840) to a similar value. To reduce the number of calibration operations performed, the memory sub-system controller 115 can combine two block families into a single block family, based on certain conditions, by updating metadata tables maintained by the memory sub-system controller 115, such as block metadata table 710 and/or block family metadata table 720 of FIG. 7. Further details regarding combining block families are provided below.

Referring back to FIG. 1, block family manager component 113 can be configured to periodically calibrate block families to be associated with an appropriate voltage bin and identify candidate block families for combination. As described above, block family manager component 113 can periodically calibrate a certain number of block families associated with a particular voltage bin. Block family manager component 113 can obtain a set of measurements to determine a current voltage for each selected block family. In response to determining that a difference between the current voltage for each selected block family satisfies a block family combination criterion, block family manager component 113 can combine the block families by updating a metadata table (e.g., block metadata table 710) to associate each block of the selected block families with a single block family. In response to combining the block families, block family manager component 113 can update metadata for the combined block family (e.g., at block family metadata table 720) to associate the combined block family with a particular voltage bin.

Figure 9:
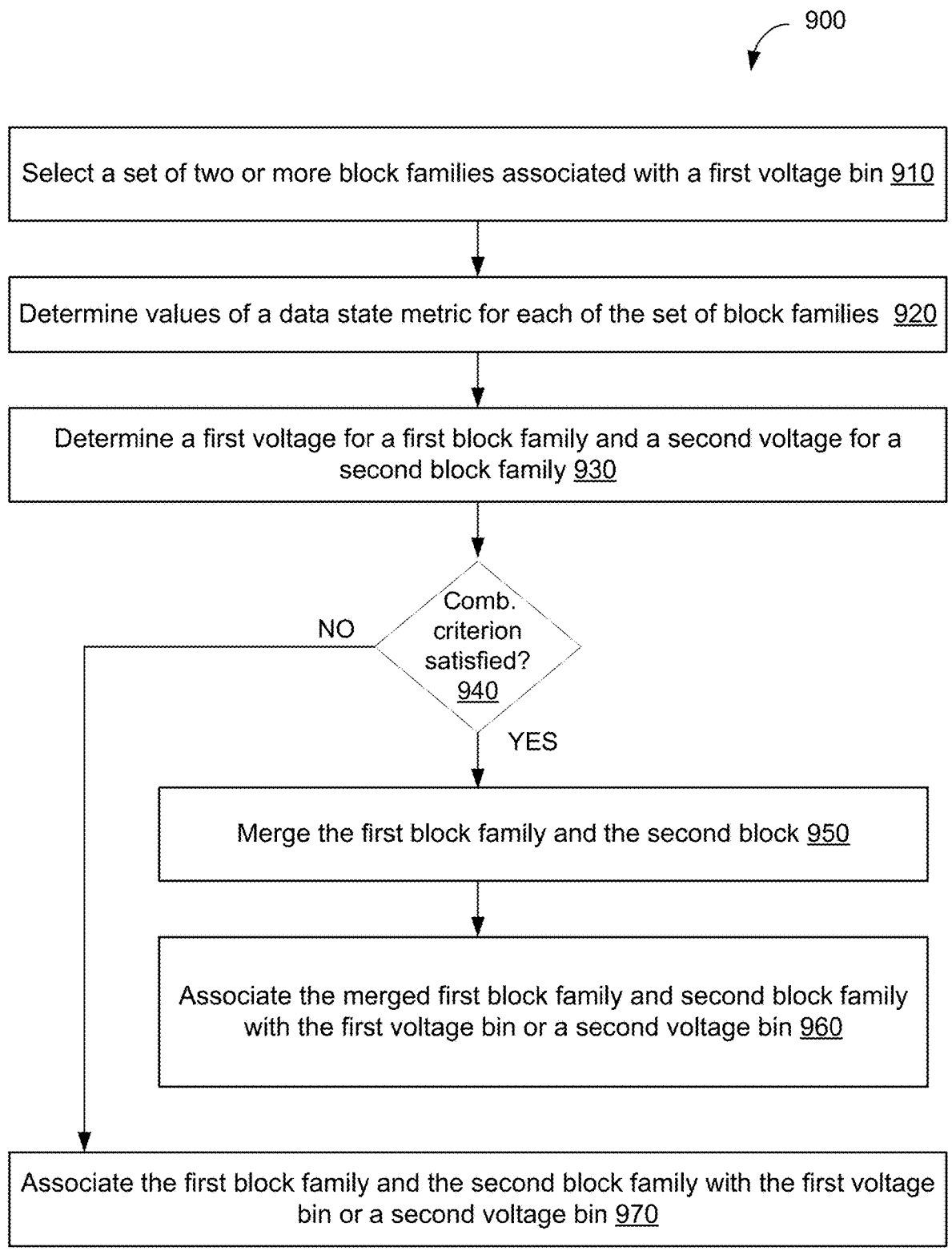
FIG. 9 is a flow diagram of an example method to combine block families and select a voltage bin for a combined block family, in accordance with embodiments of the present disclosure.

FIG. 9 is a flow diagram of an example method 900 to update a bin pointer for a voltage bin after a memory device is powered on, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. In other or similar embodiments, one or more operations of method 900 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing device selects a set of two or more block families associated with a first voltage bin. The processing device can select the set of two or more block families in response to determining a calibration scan is to be performed for the first voltage bin (e.g., based on a predefined calibration frequency for the first voltage bin). In response to determining the calibration scan is to be performed, the processing device can select the set of two or more block families associated with the first voltage bin by accessing a block family metadata table, such as block family metadata table 720 described with respect to FIG. 7. The processing device can identify, by inspecting the block family metadata table 720, a bin boundary for the first voltage bin, in accordance with previously described embodiments. In response to identifying the bin boundary for the first voltage bin, the processing device can select the set of block families to be calibrated by identifying a first block family associated with the bin boundary and a second block family that is temporally adjacent to the first block family.

FIG. 11A depicts block metadata table 710 and block family metadata table 720, described previously. As illustrated in FIG. 11A, block family 60 is associated with the bin boundary for voltage bin 0. As such, the processing device (e.g., block family manager component 113) can select block family 60 as the first block family of the set of block families. Block family 61 is the block family temporally adjacent to block family 60. Therefore, block family manager component 113 can select block family 61 as the second block family of the set of block families. In some embodiments, block family manager component 113 can select a certain number (e.g., a predefined number) of block families to be included in the set of block families. The certain number can correspond to an estimated number of block families associated with a particular voltage bin that, when combined, may be expected to exhibit data state metrics similar enough that they may be effectively calibrated together throughout their life.

Referring back to FIG. 9, at operation 920, the processing device determines values of a data state metric for each of the set of block families. In some embodiments, the processing device can determine the values of the data state metric for each block family by performing a series of read operations for each block family using a set of voltage offsets each corresponding to a voltage bin of the memory device. Each data state metric value can correspond to an error rate (e.g., a bit error rate) resulting from each read operation.

As described previously, the processing device can select more than two block families to be included in the set of block families, in some embodiments. In such embodiments, the processing device can determine the values of the data state metric for the oldest block family in the set of block families and the youngest block family in the set of block families. For example, block family manager component 113 can select block families 60, 61, and 62 as the set of block families, where block family 60 is the oldest block family in the set and block family 62 is the youngest block family in the set. In such embodiments, block family manager component 113 can determine values of the data state metrics for block families 60 and 62.

At operation 930, the processing device determines a first voltage for a first block family of the set of block families and a second voltage for a second block family based on the values of the data state metric. In some embodiments, the data state metric values determined at operation 920 can correspond to a data state metric for the block family on each die of the memory device. FIG. 12 schematically illustrates example data state metric values for each block family of the set of block families. Block family manager component 113 can determine the temporal voltage state metric values the first block family (i.e., block family 60) and the second block family (i.e., block family 61) on each die of the memory device, as illustrated in FIG. 12.

At operation 940, the processing device determines whether a block family combination criterion is satisfied. The processing device can determine the block family combination criterion is satisfied in response to determining a difference between the data state metric value for the first block family and a data state metric value on the second block family satisfy a threshold difference value. In some embodiments block family manager component 113 can determine whether the difference between the data state metric value for the first family and the second family satisfies the threshold difference value by determining whether the maximum difference in the voltage metric for each die is less than the threshold difference value. Referring to FIG. 12 by way of example, where the threshold difference value is 5 DACs, the voltage difference in die 0 between the first block family and the second block family is 1 DACs, the voltage difference in die 1 between the first block family and the second block family is 2 DACs, the voltage difference in die 2 between the first block family and the second block family is 1 DACs, and the voltage difference in die 3 between the first block family and the second block family is 4 DACs. Thus, the maximum difference in the voltage metric if each die comparison is 4 DACs. Accordingly block family manager component 113 can determine the difference between the data state metrics for the first block family and the second block family satisfy a threshold difference value and thus the block family combination criterion is satisfied.

Referring back to FIG. 9, In response to determining the block family combination criterion is satisfied, method 900 continues to operation 950. In response to determining the block family combination criterion is not satisfied (i.e., the difference between the data state metrics for the first block family and the second block family does not satisfy the threshold difference value), method 900 continues to operation 970.

At operation 950, the processing device merges the first block family and the second block family. The processing device can merge the first block family and the second block family by accessing a block metadata table, such as block metadata table 710. The processing device can identify an entry of the block metadata table 710 that corresponds to the first block family and another entry that corresponds to the second block family. As illustrated in FIG. 11A, entry 1110 corresponds to the first block family (i.e., block family 60) and entry 1112 corresponds to the second block family (i.e., block family 61). In some embodiments, a single block entry can correspond to a particular block family, as described previously. In other or similar embodiments, multiple block entries can correspond to the particular block family (e.g., at a superblock table). In such embodiments, block family manager component 113 can identify each block entry corresponding to the first block family and the second block family, respectively. Block family manager component 113 can update each block entry corresponding to the first block family to associate each block of the second block family with the first block family. As illustrated in FIG. 11B, block family manager component 113 can update block entry 1110 to associate each block of block entry 1112 with the first block family (i.e., block family 61). In response to updating the block entry associated with the first block family, block family manager component 113 can erase the second entry from the block metadata table. Alternatively, the block family manager component 113 can erase the first entry from the block metadata table. As illustrated in FIG. 11C, block family manger component 113 can erase block entry 1112, previously associated with block family 61, from block metadata table 710. As such, block entry 1112 can available for block families including subsequently written blocks. Similarly, block family manager component 113 can erase an entry for data block 61 from block family metadata table 720, as illustrated in FIG. 11C. The erased entry at block family metadata table 720 can be available for subsequent block families.

At operation 960, the processing device associates the merged first block family and the second block family with the first voltage bin or a second voltage bin based on the data state metric values determined at operation 920. For example, the processing device can update a bin pointer for the merged first block family on some or all die based on the data state metric values determined at operation 920. As illustrated in FIG. 11C, the bin pointers for block family 60 on each die have been updated so that each bin pointer corresponds to voltage bin 1. As each bin pointer associated with block family 60 now corresponds to voltage bin 1, block family 60 is no longer associated with the bin boundary for voltage bin 0 and instead has shifted into voltage bin 1. As such, block family manager component 113 can update the elements of bin pointer vector 722 for block family 62 to point to voltage bin 1 for some or all of the die, in accordance with previously described embodiments. In some embodiments, a bin pointer can move by more than one bin (e.g., form bin 1 to bin 4).

In some embodiments, block family manager component 113 can continue to scan block families not included in the set of selected block families. For example, in response to determining that block family 60 has shifted to voltage bin 1, block family manager component 113 can perform the operations of method 900 for block families 62 and 63 to determine whether those block families should be combined and/or whether block families 62 and 63 should be associated with voltage bin 1. Further details regarding block family manager component 113 scanning additional block families are provided with respect to FIG. 10.

As described previously, in response to the processing device determining, at operation 940, that the block family combination criterion is not satisfied, method 900 continues to operation 970. At operation 970, the processing device associates the first block family and the second block family with the first voltage bin or a second voltage bin based on the first voltage and the second voltage, in accordance with previously described embodiments.

In some embodiments, block family manager component 113 can detect that the memory sub-system does not have enough memory available (e.g., at memory device 130, 140, local memory 119, etc.) to track block families for a particular voltage bin. This can occur as a result of block families being created or shifted into the voltage bin at a higher rate than block families in that voltage bin being combined. In such embodiments, block family manager component 113 can modify the block family combination criterion to increase a number of block families in the voltage bin that are candidates for combination. For example, as previously described, a threshold difference value associated with the block family combination criterion for voltage bin 0 is 5 DACs. Block family manager component 113 can increase the threshold difference value (e.g., to 7 DACs) to increase the number of block families in the voltage bin that are identified as candidates for combination. In some instances, the block family manager component 113 can increase the threshold difference value to a maximum difference value. The maximum threshold difference value can indicate a maximum voltage difference between two block families where a common threshold offset value can be effectively applied to both block families. In some embodiments, the block family manager component 113 can determine that, even after modifying the block family combination criterion to correspond to the maximum threshold difference value, the memory sub-system does not have enough memory available to track block families for the voltage bin. As such, block family manager component 113 can initiate a block family combination scan operation to identify block families in the voltage bin that are candidates for combination. The block family combination scan can be performed separately from the calibration scan.

In other or similar embodiments, block family manager component 113 can detect that memory sub-system has enough memory available to track block families for the voltage bin and, in some instance, too many block families in the voltage bin are identified as candidates for combination. In such embodiments, block family manager component 113 can modify the block family combination criterion to decrease the number of block families in the voltage bin that are candidates for combination. In accordance with the previous example, block family manager component 113 can decrease the threshold difference value for voltage bin 0 (e.g., to 3 DACs) to decrease the number of block families in the voltage bin 0 that are identified as candidates for combination.

Figure 10:
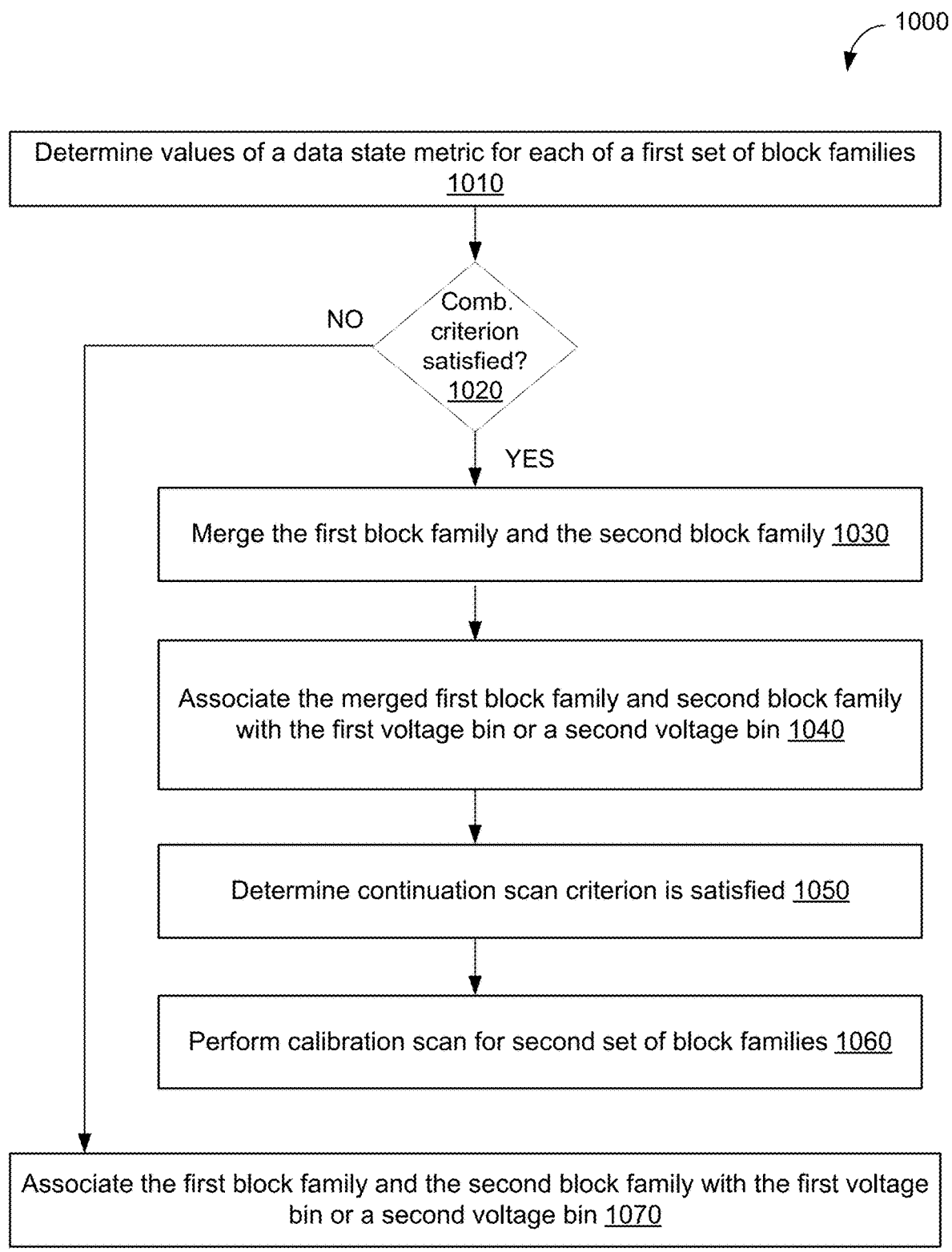
FIG. 10 is a flow diagram of another example method to combine block families and select a voltage bin for a combined block family, in accordance with embodiments of the present disclosure.

FIG. 10 is a flow diagram of another example method 800 to update a bin pointer for a voltage bin after memory device power on, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. In other or similar embodiments, one or more operations of method 1000 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, the processing device determines values of a data state metric for each of a first set of block families. The processing device can determine the values of the data state metrics for the first set of block families in accordance with previously described embodiments. At operation 1020, the processing device determines whether a voltage for each of the first set of block families satisfies a block family combination criterion, in accordance with previously described embodiments. In response to determining that the block family combination criterion is satisfied, method 1000 continues to operation 1030. In response to determining that the block family combination criterion is not satisfied, method 1000 continues to operation 1070, where the processing device associates the first block family and the second block family of the first set of block families with the first voltage bin or the second voltage bin, in accordance with previously disclosed embodiments.

At operation 1030, the processing device merges the first block family and the second block family and, at operation 1040, associates the merged first block family and second block family with the first voltage bin or a second voltage bin, in accordance with previously described embodiments. At operation 1050, the processing device determines whether a continuation scan criterion is satisfied. In some embodiments, the processing device can determine the continuation scan criterion is satisfied in response associating the merged first block family and second block family with the second voltage bin. For example, as described with respect to FIG. 11C, after performing the calibration scan for voltage bin 0, block family manager component 113 can associate merged block family 60, the block family previously associated with the bin boundary for voltage bin 0, with voltage bin 1. As block family 60 is not associated with voltage bin 0 and is now associated with voltage bin 1, block family manager component 113 can determine that the continuation scan criterion is satisfied. In other or similar embodiments, block family manager component 113 can determine that the continuation scan criterion is satisfied in response to determining that a number of unavailable block families at the memory device satisfies a threshold number.

At operation 1060, the processing device can perform the calibration scan for a second set of block families. The processing device can select two or more block families associated with the first voltage bin, in accordance with previously described embodiments. For example, referring to FIG. 11C, the block family manager component 113 can select block family 62 as a first block family in the second set of block families and block family 63 as a second block family in the second set of block families, as block family 62 is now the oldest block family associated with voltage bin 0 and block family 63 is temporally adjacent to block family 62. Block family manager component 113 can perform the calibration scan for the second set of block families in accordance with previously described embodiments.

Figure 13:
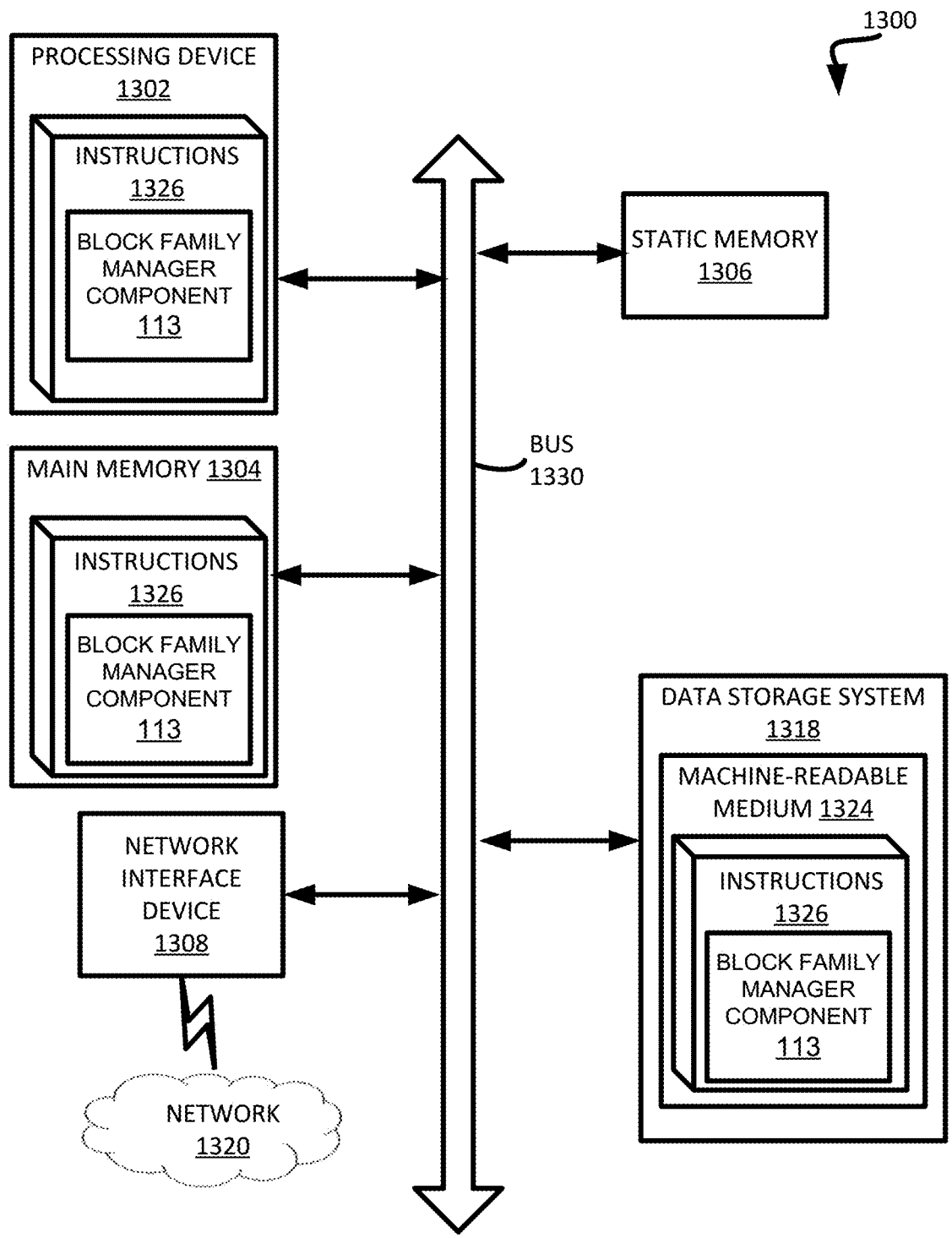
FIG. 13 is a block diagram of an example computer system in which embodiments of the present disclosure may operate.

FIG. 13 illustrates an example machine of a computer system 1300 within which a set of instructions, for causing the machine to perform any one or more of the methodologies discussed herein, can be executed. In some embodiments, the computer system 1300 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM) or RDRAM, etc.), a static memory 1306 (e.g., flash memory, static random access memory (SRAM), etc.), and a data storage system 1318, which communicate with each other via a bus 1330.

Processing device 1302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 can also be one or more special-purpose processing devices such as an application specific integrated circuit (ASIC), a field programmable gate array (FPGA), a digital signal processor (DSP), network processor, or the like. The processing device 1302 is configured to execute instructions 1326 for performing the operations and steps discussed herein. The computer system 1300 can further include a network interface device 1308 to communicate over the network 1320.

The data storage system 1318 can include a machine-readable storage medium 1324 (also known as a computer-readable medium) on which is stored one or more sets of instructions 1326 or software embodying any one or more of the methodologies or functions described herein. The instructions 1326 can also reside, completely or at least partially, within the main memory 1304 and/or within the processing device 1302 during execution thereof by the computer system 1300, the main memory 1304 and the processing device 1302 also constituting machine-readable storage media. The machine-readable storage medium 1324, data storage system 1318, and/or main memory 1104 can correspond to the memory sub-system 110 of FIG. 1.

In one embodiment, the instructions 1326 include instructions to implement functionality corresponding to a voltage bin boundary component (e.g., the block family manager component 113 of FIG. 1). While the machine-readable storage medium 1324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
selecting a plurality of block families associated with a first voltage bin, wherein each block family comprises a plurality of pages of a memory device that have been programmed within a corresponding time window, and wherein the plurality of block families comprises a first block family and a second block family;
determining values of a data state metric for each of the plurality of block families;
determining, based on the values of the data state metric, a first voltage for the first block family and a second voltage for the second block family; and
responsive to determining that a difference between the first voltage and the second voltage satisfies a block family combination criterion, merging the second block family with the first block family.

2. The method of claim 1, wherein selecting the plurality of block families associated with the first voltage bin comprises:
accessing a block family metadata table comprising an entry for each block family of the memory device; and
identifying, by inspecting the block family metadata table, a bin boundary for the first voltage bin,
wherein the first block family of the plurality of block families is associated with the bin boundary of the first voltage bin and the second block family is temporally adjacent to the first block family.

3. The method of claim 1, further comprising:
associating the merged first block family and the second block family with the first voltage bin or a second voltage bin based on the first voltage and the second voltage.

4. The method of claim 1, wherein the plurality of block families further comprises a third block family, wherein the third block family is temporally adjacent to the first block family and the second block family.

5. The method of claim 1, wherein determining the values of the data state metric for each of the plurality of block families comprises:

performing a series of read operations for a particular block family of the plurality of block families using a set of voltage offsets, wherein a value of the data state metric for the particular block family corresponds to an error rate resulting from one or more of the series of read operations.

6. The method of claim 1, wherein the difference between the first voltage and the second voltage satisfies the block family combination criterion responsive to exceeding a difference threshold value.

7. The method of claim 6, further comprising:

responsive to determining that a number of unavailable block families associated with the first voltage bin exceeds a threshold number of unavailable block families, modifying the difference threshold value.

8. The method of claim 1, wherein merging the second block family with the first block family comprises:

accessing a block metadata table comprising an entry for one or more pages of a memory device, wherein each entry comprises an indication of a particular block family associated with respective pages;

identifying, at the block metadata table, a first entry corresponding to the first block family and a second entry corresponding to the second block family;

updating the first entry to associate respective pages of the second block family with the first block family; and erasing the second entry from the block metadata table.

9. The method of claim 8, further comprising:

receiving a request to read data from respective pages of the second block family;

determine a threshold voltage offset associated with the second block family based on the updated first block entry of the block metadata table;

compute a modified threshold voltage by applying the threshold voltage offset to a base read level voltage associated with the memory device; and read, using the modified threshold voltage, data from a block of the second block family.

10. A system comprising:

a memory device; and a processing device coupled to the memory device, the processing device to perform operations comprising:

determining values of a data state metric for each of a first plurality of block families associated with a first voltage bin, wherein each block family comprises a plurality of pages of a memory device that have been programmed within a corresponding time window, and wherein each measurement value corresponds to a state of data for a particular block family of the first plurality of block families;

responsive to determining, based on the values of the data state metric for each of the first plurality of block families, that a voltage for each of the first plurality of block families satisfies a block family combination criterion, merging each block family of the first plurality of block families;

responsive to determining that a continuation scan criterion is satisfied, selecting a second plurality of block families associated with the first voltage bin; and performing a calibration scan for each block family of the second plurality of block families.

11. The system of claim 10, wherein the processing device is to determine that the continuation scan criterion is satisfied responsive to:

associating the merged first plurality of block families with a second voltage bin based on a voltage shift for each of the first plurality of block families.

12. The system of claim 10, wherein the processing device is to determine that the continuation scan criterion is satisfied responsive to:

determining that a number of unavailable block families at the memory device satisfies a threshold number.

13. The system of claim 10, wherein to determine the values of the data state metric for each of the first plurality of block families, the processing device is to perform operations comprising:

performing a series of read operations for a particular block family of the first plurality of block families using a set of voltage offsets, wherein a value of the data state metric for the particular block family corresponds to an error rate resulting from one or more of the series of read operations.

14. The system of claim 10, wherein the processing device determines that the voltage for each of the first plurality of block families satisfies the block family combination criterion responsive to determining a difference between a first voltage for a first block family of the first plurality of block families and a second voltage for a second block family of the first plurality of block families exceeds a difference threshold value.

15. The system of claim 10, wherein the first plurality of block families comprises a first block family and a second block family, wherein the first block family is associated with a bin boundary for the first voltage bin and the second block family is temporally adjacent to the first block family, and wherein a third block family of the second plurality of block families is temporally adjacent to the second block family.

16. A non-transitory computer-readable storage medium comprising instructions that, when executed by a processing device, cause the processing device to perform operations comprising:

selecting a plurality of block families associated with a first voltage bin, wherein each block family comprises a plurality of pages of a memory device that have been programmed within a corresponding time window, and wherein the plurality of block families comprises a first block family and a second block family;

determining values of a data state metric for each of the plurality of block families;

determining, based on the values of the data state metric, a first voltage for the first block family and a second voltage for the second block family; and responsive to determining that a difference between the first voltage and the second voltage satisfies a block family combination criterion, merging the second block family with the first block family.

17. The non-transitory computer-readable storage medium of claim 16, wherein to select the plurality of block families associated with the first voltage bin, the processing device is to perform operations comprising:

accessing a block family metadata table comprising an entry for each block family of the memory device;

identifying, by inspecting the block family metadata table, a bin boundary for the first voltage bin, wherein the first block family of the plurality of block families is associated with the bin boundary of the first voltage bin and the second block family is temporally adjacent to the first block family.

18. The non-transitory computer-readable storage medium of claim 16 wherein the processing device is to perform operations further comprising:
    associating the merged first block family and the second block family with the first threshold voltage bin or a second threshold voltage bin based on the first voltage and the second voltage.

19. The non-transitory computer-readable storage medium of claim 16, wherein the plurality of block families further comprises a third block family, wherein the third block family is temporally adjacent to the first block family and the third block family.

20. The non-transitory computer-readable storage medium of claim 16, wherein to determine values of the data state metric for each of the plurality of block families, the processing device is to perform operations comprising:
    performing a series of read operations for a particular block family of the plurality of block families using a set of voltage offsets,
    wherein a value of the data state metric for the particular block family corresponds to an error rate resulting from one or more of the series of read operations.

* * * * *